_(12)_ United States Patent
Shah

(10) Patent No.: US 11,184,111 B1
(45) Date of Patent: Nov. 23, 2021

(54) METHOD, SYSTEM, AND PRODUCT TO PROVIDE AN IMPROVED APPROACH TO PERFORM POLAR ENCODING

(71) Applicant: Cadence Design Systems, Inc., San Jose, CA (US)

(72) Inventor: Poojan Rajeshbhai Shah, Ahmedabad (IN)

(73) Assignee: Cadence Design Systems, Inc., San Jose, CA (US)

( * ) Notice: Subject to any disclaimer, the term of this patent is extended or adjusted under 35 U.S.C. 154(b) by 92 days.

(21) Appl. No.: 16/587,050

(22) Filed: Sep. 30, 2019

(51) Int. Cl.
*H04L 1/00* (2006.01)
*H03M 13/13* (2006.01)
*G06F 7/08* (2006.01)

(52) U.S. Cl.
CPC .............. *H04L 1/0057* (2013.01); *G06F 7/08* (2013.01); *H03M 13/13* (2013.01); *H04L 1/0043* (2013.01)

(58) Field of Classification Search
CPC ....... H04L 1/0057; H04L 1/0043; G06F 7/08; H03M 13/13
See application file for complete search history.

(56) References Cited

U.S. PATENT DOCUMENTS

2003/0233340 A1* 12/2003 Flasza .................. G06F 7/24
2019/0207709 A1*  7/2019 Chen .................. H03M 13/13

\* cited by examiner

*Primary Examiner* — Yemane Mesfin
*Assistant Examiner* — Henry Baron
(74) *Attorney, Agent, or Firm* — Vista IP Law Group, LLP

(57) ABSTRACT

An approach is described for a method, system, and product, the approach includes setting up a sorted unique value array, receiving a user input, receiving data for polar encoding, generating an output array based on locations determined using the sorted unique value array and values determined using the data for polar encoding, and transmit data using 5g wireless communication protocol that has been processed by polar encoding.

20 Claims, 20 Drawing Sheets

FIG. 5B

Binary Value Lookup Table (L) 503

| Index | Binary Flag |
|---|---|
| 0 | 0 |
| 1 | 0 |
| 2 | 0 |
| 3 | 0 |
| 4 | 0 |
| 5 | 0 |
| 6 | 0 |
| 7 | 0 |
| 8 | 0 |
| 9 | 0 |
| 10 | 0 |
| 11 | 0 |
| 12 | 0 |
| 13 | 0 |
| 14 | 0 |
| 15 | 0 |

Initialize All Binary Flags 511

Input Array (Q) 501

| 14 | 4 | 0 | 7 | 11 | 15 | 12 | 8 | 6 | 2 |
|---|---|---|---|---|---|---|---|---|---|

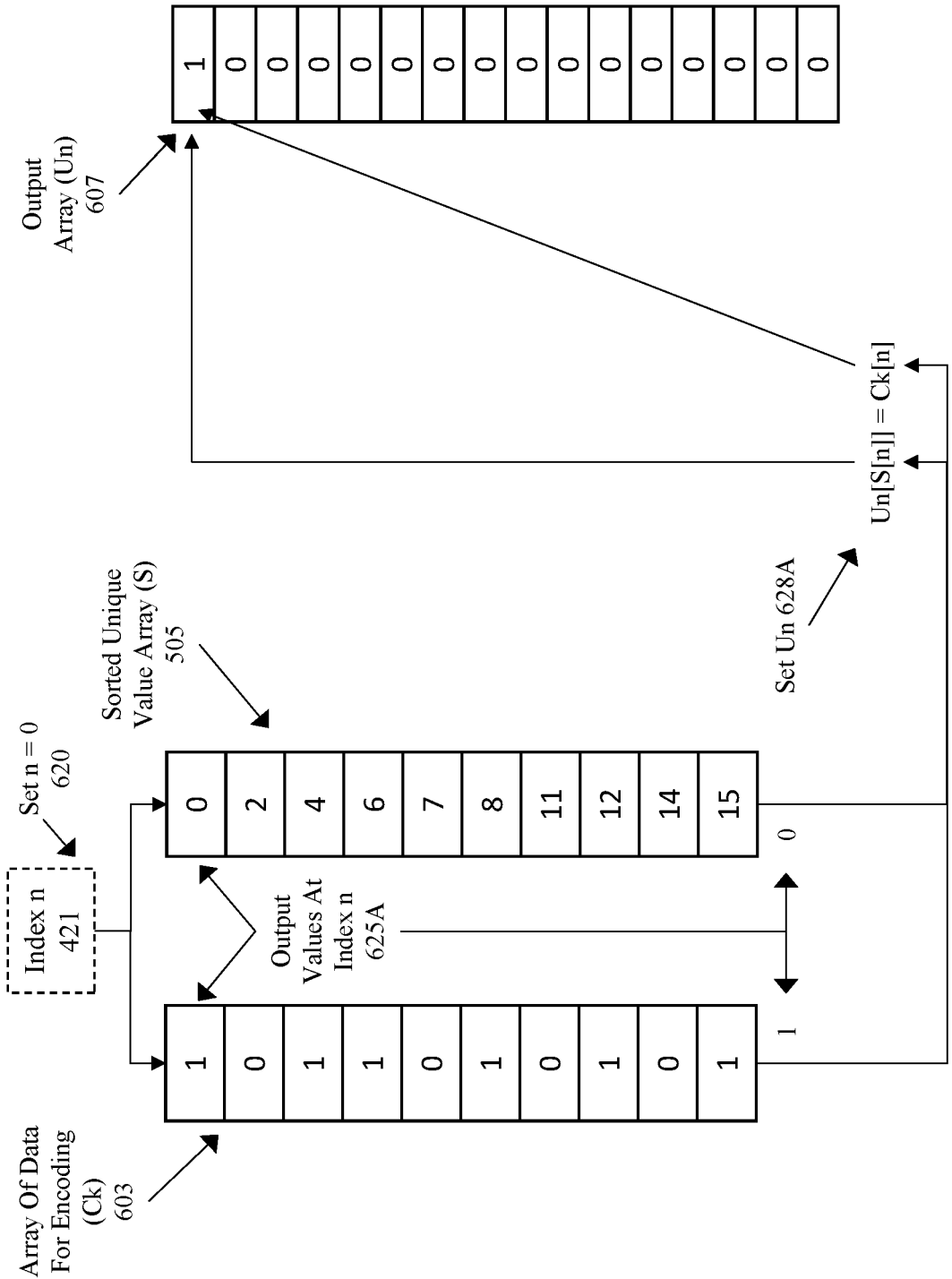

METHOD, SYSTEM, AND PRODUCT TO PROVIDE AN IMPROVED APPROACH TO PERFORM POLAR ENCODING

BACKGROUND

Semiconductor devices are used in a variety of electronic applications, such as personal computers, cell phones, digital cameras, and other electronic equipment. However, engineering semiconductors to achieve higher and higher performance is only one way in which performance is improved. Another approach to improving performance is achieved by utilizing or creating more efficient algorithms—e.g. algorithms that require fewer clock cycles and/or instructions to complete or that increases parallelism.

One particularly important area for improving performance is for latency or time sensitive operations, especially those that are required to complete within a given time period. For example, the 5G polar encoding flow requires that the encoding be completed within a specific time frame.

Another issue that is often associated with improved performance is increased power consumption, which may be due to higher clock frequencies or an increase in the number of operations required. However, as devices have become more portable, battery sizes have generally stayed the same if not decreased. Thus, anything that can be done to decrease the power consumed by these devices can result in improved function for users of these devices by increasing the time these devices will operate for without requiring to be plugged into a power source. Additionally, in the case of wireless communications base stations, an approach that decreases the power consumption of these base stations can be beneficial because it lowers cooling requirements and electrical consumption.

One technique for performing channel encoding (e.g. 5G 3GPP TS 38.212 V15.2.0 SECTION 5.3.1.2 channel encoding) might rely on array lookup operations in order to generate output data. For example, for each piece of input data a lookup operation is completed. This lookup operation will generally comprise multiple comparison operations to search for a corresponding value in a second table. Unfortunately, this results in a multiplier effect where for each value in the input data, on average, a plurality of comparison operations are completed. Furthermore, as the number of possible values increases, so does the average amount of comparison operations that have to be completed to execute the lookup operation. Unfortunately, the shear number of operations and the cost of these operations in terms of time and power consumption are less than ideal.

Therefore, what is needed is improve approach to perform channel coding in a polar encoding chain of communications protocols.

SUMMARY

Embodiments of the present invention provide a method, system, and product to provide an improved approach to perform polar encoding.

According to some embodiments, the approach includes setting up a sorted unique value array, receiving a user input, receiving data for polar encoding, generating an output array based on locations determined using the sorted unique value array and values determined using the data for polar encoding, and transmit data using 5 g wireless communication protocol that has been processed by polar encoding.

Other additional objects, features, and advantages of the invention are described in the detailed description, figures, and claims.

BRIEF DESCRIPTION OF FIGURES

In order that the present invention is better understood, some embodiments of the invention will now be described, by way of example only, with reference to the accompanying drawings.

FIGS. 5A-5K illustrate an example of a flow of an approach to setup the sorted unique value array as in 200 of FIG. 2 and in FIG. 3 according to some embodiments.

FIGS. 6A-6D illustrate an example of a flow of an approach to generate an output array based on locations determined using the sorted unique value array and values determined using the data for polar encoding as in 204 of FIG. 2 according to some embodiments.

DETAILED DESCRIPTION

Embodiments of the present invention provide a method, system, and product to provide an improved approach to perform polar encoding.

Various embodiments are described hereinafter with reference to the figures. It should be noted that the figures are not necessarily drawn to scale. It should also be noted that the figures are only intended to facilitate the description of the embodiments, and are not intended as an exhaustive description of the invention or as a limitation on the scope of the invention. In addition, an illustrated embodiment need not have all the aspects or advantages shown. An aspect or advantage described in conjunction with a particular embodiment is not necessarily limited to that embodiment and can be practiced in any other embodiments even if not so illustrated.

In some embodiments, the approach includes generating a sorted array of unique values from an input table (e.g. information bit indices (interleaved) array $\overline{Q}_1^N$), herein (Q). Once sorted, the values can be used to provide a one-to-one lookup and record operations. For example, for each index value in a range of index values required to encode data to be transmitted during the channel coding process, a value from the sorted array of unique values and data to be encoded (Ck) at the same index are used to populate an output data structure (e.g. array). In particular, the output of the sorted array of unique values is used as an index for the output array and the data to be encoded is used as the value to be recorded in the output array, where both values correspond to the same index value as will be illustrated below. Thus, the data to be encoded can be traversed by executing the same instruction(s) for each index value without requiring a lookup operation that on average includes some number of comparison operations. Instead, the number of instructions needed can be known prior to execution and doesn't require execution of costly comparison operations.

The following passages describe an improved approach to perform polar encoding in the context of the 5G wireless communications protocol. However, while the approach is described in the context of 5G wireless communications protocol, the approach may be applied to other communications protocols including at least any wireless communications protocol or wired communications protocol that utilizes polar encoding.

Figure 1:
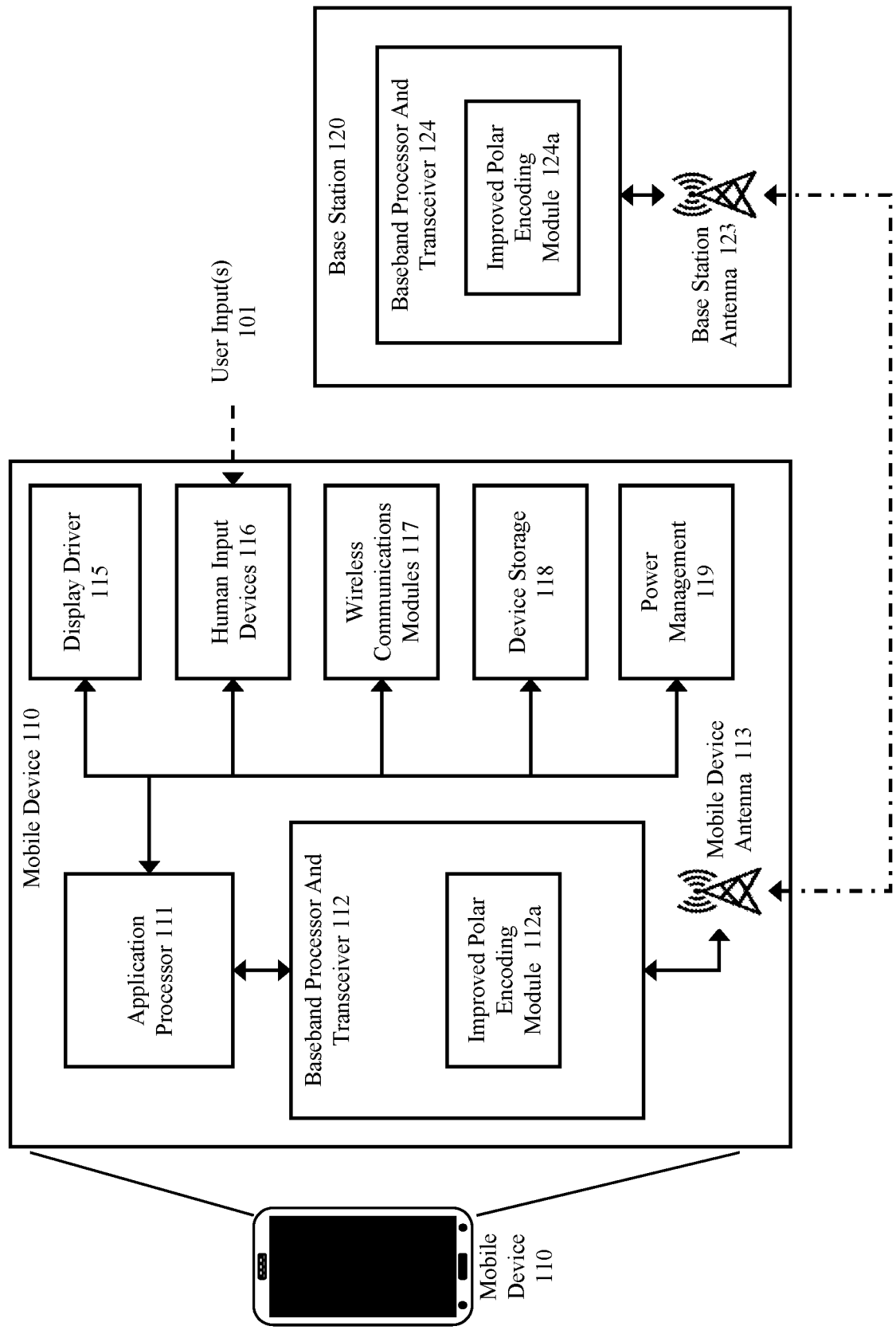
FIG. 1 illustrates an example system including improved polar encoding modules according to some embodiments.

FIG. 1 illustrates an example system including improved polar encoding modules according to some embodiments. As illustrated, both a mobile device and a base station include an improved polar encoding module. However, in some embodiments, only one of the mobile device or the base station is included the improved polar encoding module. The arrangement provided herein includes the improved polar encoding module. However, the improved polar encoding module could be provided in other devices that implement polar encoding.

Mobile device 110 includes an application processor 111, a baseband processor and transceiver 112, a mobile device antenna 113, display driver 115, human input device 116, wireless communications modules 117, device storage 118, and power management 119. The mobile device 110 may comprise a cell phone or a tablet with a cellular communications capability.

The application processor 111 performs processing duties for applications and the operating system. In some embodiments, the application processor comprises one or more virtual processing elements and/or one or more physical processing elements—e.g. a multi-core processor. Instructions for the applications generally comprise a set of instructions corresponding to instructions to generate a display view for a user which is facilitated by a mobile device operating system (OS). Generally, at least some of these instructions will result in requests for data or transmission of data over a wireless network—e.g. a web browser or phone call application sending and/or receiving data.

The baseband processor and transceiver 112 processes data received and transmitted over wireless bands for cellular communications. While cellular communications can be used to transmit data representing user voices, cellular communications can also be used to transmit data between applications. Cellular communications themselves are processed using a baseband processor and transceiver 112 that implements one or more cellular communications protocols (e.g. code division multiple access (CDMA), frequency division multiple access (FDMA), or time division multiple access (TDMA), etc.). For example, a baseband processor might comprise a digital signal processing portion, a digital to analog conversion portion, and a radio frequency conversion/modulation portion. However, one drawback of these communications is the large amount of power that may be consumed by devices to execute the corresponding exchanges of data. Thus, the improved polar encoding module 112a provided herein can be used to decrease the latency caused by processing communications data prior to transmission and to decrease the amount of power consumed by these processes. Additionally, once processed the communications are eventually output to the mobile device antenna 113 to transmit the data over the air which should be received by a base station at a base station antenna 120.

Similar to the baseband processor and transceiver 112, a base station 120 also includes a baseband process and transceiver 124. The baseband processor and transceiver 120 may be similar or the same the baseband processor and transceiver 112. For instance, baseband processor and transceiver 112 in the mobile device might be the same as the baseband processor and transceiver 124—e.g. both are the same chip model or the same design on the same process in different chips. Alternatively, the base station 120 might include a different baseband processor and transceiver 120, such as a processor that connects to one or more antennas (base station antenna 123) and includes support for more simultaneous or overlapping communications over more communications channels. Additionally, other variations can include multiple antennas at one or more different power/transmission levels. Regardless of the specific arrangement at the base station 120, the base station provides a communications gateway between the cellular communications technology and one or more other communications technologies (e.g. data over fiber, cable, or telephone lines) to service requests and responses from the mobile device 110, and to push data to the mobile device 110 on behalf of a base station operator or contracted carrier.

The display driver 115 receives data corresponding to what is to be displayed on the screen of the device to a user. Displays may comprise any number of technologies, such a liquid crystal display (LCD), organic light emitting diode (OLED), or even plasma displays to name a few. The display driver uses the data received from or as a result of the processor processing instructions in order to generate, or as part of generating, a visual representation of a graphical user interface (GUI). For instance, the display driver will generate data and place that data in a frame buffer, where the contents of the frame buffer correspond to the color and intensity of the pixels of the display when they are used as the inputs to control the pixels of the display.

Human input devices 116 are configured to be responsive to user inputs. For example, the human input devices 116 receive user input(s) 101. Such inputs could comprise inputs generated through user interaction with a touch screen interface, or through some combination of physical buttons or switches. For instance, the user input(s) 101 received from a user via a touch screen interface might cause the device to call a contact stored in the device storage 118 of the mobile device 110, or to load a webpage in response to a selection/entry of a website address from a user.

Wireless communications modules 117 may include support for various communications protocols, such as Wi-Fi, ZigBee, Bluetooth, Near field, or any other short-range wireless signals. Use of most of these communications protocols is quite prevalent, and depending on the particular application that is being executed the communications protocols required may differ. For instance, a mobile conferencing tool preferring a Wi-Fi connection over a cellular connection might not need any other communications protocols except perhaps Bluetooth for Bluetooth audio devices. In contrast, a mobile payment application may require near a field communications protocol and a cellular connection, but not Bluetooth or Wi-Fi (e.g. use the cellular connection to get a one-time payment token, and the near field communications protocol to provide the token to the seller).

Device storage 118 comprises volatile and/or non-volatile storage. Volatile storage may comprise random access memory (RAM) used to store data temporarily (e.g. data used to run an application), data to be written to a non-volatile storage device (e.g. a flash memory), or data read from a read only memory (ROM) (e.g. device identifying information set at the factory or at the first installation of the mobile device OS 113).

Power management 119 corresponds to a power management unit. Power management units perform the necessary monitoring and charging functions for the device such as determining when and at what rate to charge a battery and determining the current state of a battery. Furthermore, the power management unit 119 may be configured to trigger one or more interrupts corresponding to a current state of the devices power system such as an interrupt that indicates that the device is charging, the device is plugged in but not charging, the device is not charging, the device is discharging the battery, the battery level is below one or more thresholds, or the battery level is critically low. In this way, power management 119 provides pertinent information to a mobile device OS and possibly to the applications, enables the OS to effectuate appropriate settings changes and/or notifies the user of the system status. However, in some embodiments the power management unit may be polled periodically or at some other interval to determine the current state of the power circuitry.

Figure 2:
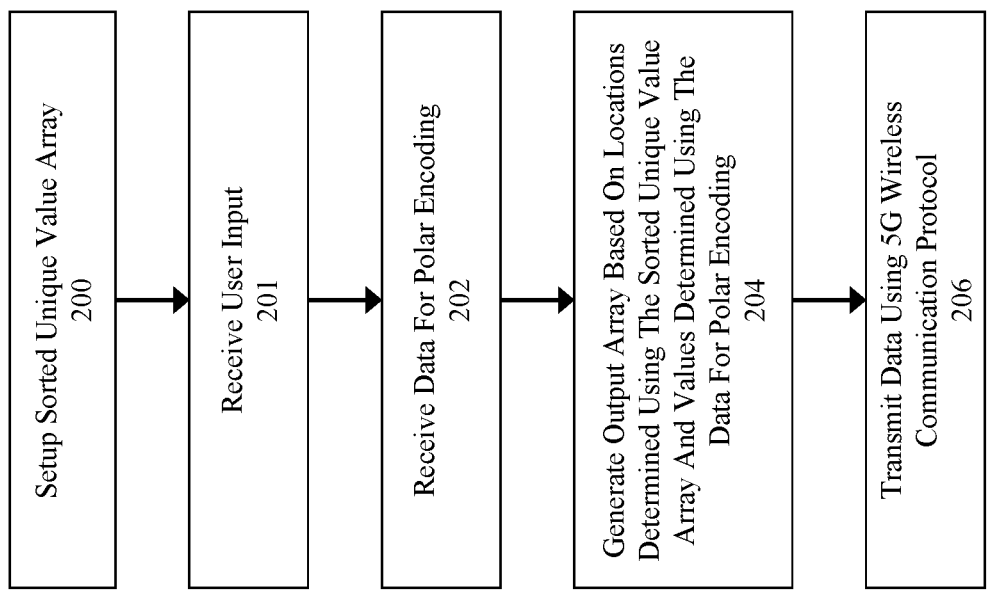
FIG. 2 illustrates a flow for performing a portion of the channel coding process in the polar encoding flow using an improved channel coding process according to some embodiments.

FIG. 2 illustrates a flow for performing a portion of the channel coding process in the polar encoding flow using an improved channel coding process according to some embodiments. Generally, the process includes steps which do not require the use of comparison operations for values within tables which can slow down processing. The process includes a setup phase that, in some embodiments, is implemented prior receiving data for encoding. Additionally, a user input is received that ultimately results in receiving data for channel coding. The receipt of data to be encoded may trigger a coding process performed using the results of the setup processes to speed up the coding. Finally, coded data may be transmitted wirelessly in compliance with a 5G communications protocol.

At 200, a sorted unique value array is set up. Generally, the approach operates on an input array (Q) to generate a sorted unique value array (S) which is valid until some relevant parameters change. Under most circumstances, the input array (Q) is a known quantity and corresponds to various communications parameters. Thus, in some embodiments, a plurality of versions of the sorted unique value array (S) might be precomputed and stored on non-volatile storage or in memory. For instance, the sorted unique value arrays might be computed at the time of manufacture for one or more common parameter sets, for one or more carriers, or one or more regions. Additionally, in some embodiments, a plurality of versions of the sorted unique value array might be precomputed and stored in volatile or non-volatile storage in response to one or more predictions that each of the stored version(s) of the sorted unique value array might be needed in the near term (e.g. for switching cellular communications channels or for switching cellular towers/base stations). In some embodiments, the setup of the sorted unique value array 200 might be performed in response to a user input, an expiration of the sorted unique value array, or some combination thereof. The process disclosed here will be discussed below in regard to FIG. 3.

In some embodiments, a user input is received at 201. For instance, in some embodiments a user input is received that triggers the creation of data for wireless transmission. For example, a user input might comprise triggering the loading of a web page, checking email, transmitting a text message (e.g. short message service (SMS), or conducting a voice over internet protocol communication.

At 202, data for channel coding is received. The data for polar encoding might be received at any time in relation to the sorted unique value array setup process at 200. In particular, the approach illustrated herein is relevant to 5G polar encoding (e.g., 3GPP TS 38.212 V15.2.0 SECTION 5.3.1.2) in the channel coding step. However, whereas the indicated section specifies use of polar encoding for control/scheduling information (e.g. downlink or uplink connection management data), the approach illustrated herein could also be used for encoding of user data—e.g. as a result of a request or response from a user device, loading an element of a web page, conducting a telephone call, connecting to a base station, etc. Regardless of what caused the generation of the data for channel coding, the process will trigger the generation of output data for transmission. Additionally, the approach provides herein could be utilized in any other polar encoding flows where relevant.

At 204, an output array is generated based on locations determined using the sorted unique value array and values determined using the data for channel coding. As will be discussed further below, this process can be completed without the use of comparison operations for values within tables (let alone multiple pluralities of comparison operations) and thus, tends to speed up processing of data for 5G polar encoding.

At 206, the final encoding of the data for transmission is transmitted using a 5G wireless communication protocol. For instance, the data that has been encoded using the polar process is output to the mobile device antenna (e.g. mobile device antenna 113) to be received by a base station (e.g. base station antenna 123) using one or more transceivers.

Figure 3:
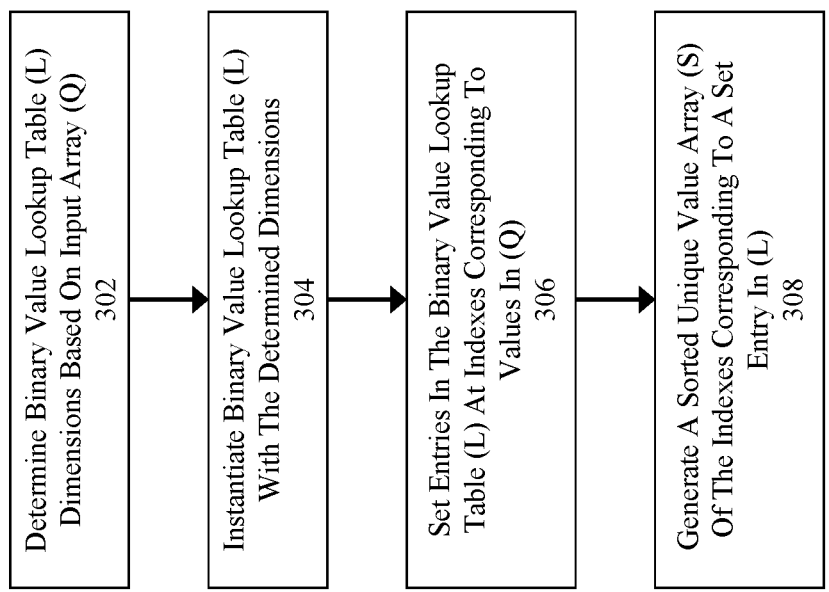
FIG. 3 illustrates a flow of an approach to setup the sorted unique value array as in 200 of FIG. 2 according to some embodiments.

FIG. 3 illustrates a flow of an approach to setup the sorted unique value array as in 200 of FIG. 2 according to some embodiments. Generally, the process accepts an input array, instantiates a binary value lookup table have a corresponding dimension, and sets entries in the binary value lookup table, which is then traversed to generate a sorted unique value array.

The process starts at 302, where the dimensions of the binary value lookup table (L) are determined based on the input array (Q) (discussed above). This can be accomplished by looking at one or more parameters associated with the input array (Q) which gives the range of the possible values that can be in (Q). For example, the input array (Q) can comprise values from 0 to 511. In which case, the binary value lookup table (L) will need to have 512 entries.

At 304 the binary value lookup table (L) is generated with the determined dimension. For instance, a binary table is created having 512 binary flags (e.g. single bit or Boolean entries at indexes 0-511). Additionally, in some embodiments, the entries of the binary value lookup table (L) are instantiated to false/zero to simplify the processing.

At 306, entries in the binary value lookup table (L) are set to true/one where they correspond to values in the input array (Q). Specifically, the input array (Q) is traversed, where an entry in Q at a given index is used to set a corresponding entry in (L) at an index equal to the value in (Q). For example, if the input array at Q[5]=12, then the binary flat at L[12] is set to true/one. Thus, using an index value (i) to traverse the input array Q and to set L can be represented by the pseudo code: while (i<SIZE_OF_Q) {L[Q[i]]=1;}.

At 308, a sorted unique value array (S) is generated that comprises the index values that correspond to the values set in the binary value lookup table (L). For example, the binary value lookup table (L) can be traversed, where any time that a binary flag is set, an entry is added to sorted unique value array (S) that is equal to the index of the set binary flag value. Therefore, by traversing the binary value lookup table (L) from low to high indexes creates a sorted unique value array (S) having an order from lowest to highest. Alternatively, traversing the binary value lookup table (L) from high to low indexes creates a sorted unique value array (S) having an order from highest to lowest.

Figure 4A:
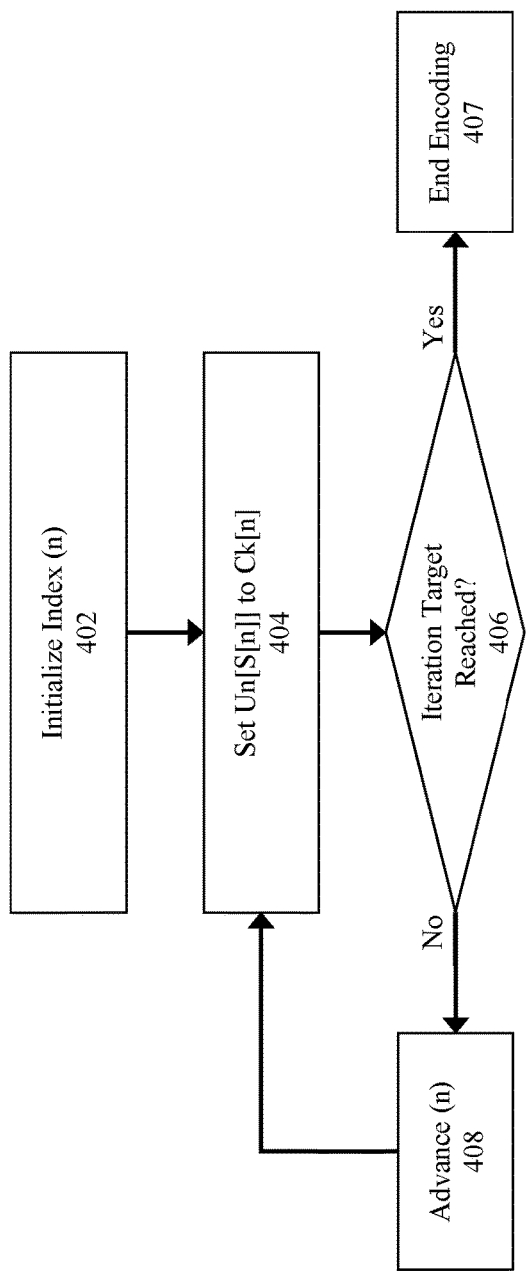
FIGS. 4A-4B illustrate a flow of an approach to generate an output array based on locations determined using the sorted unique value array and values determined using the data for polar encoding as in 204 of FIG. 2 according to some embodiments.
Figure 4B:
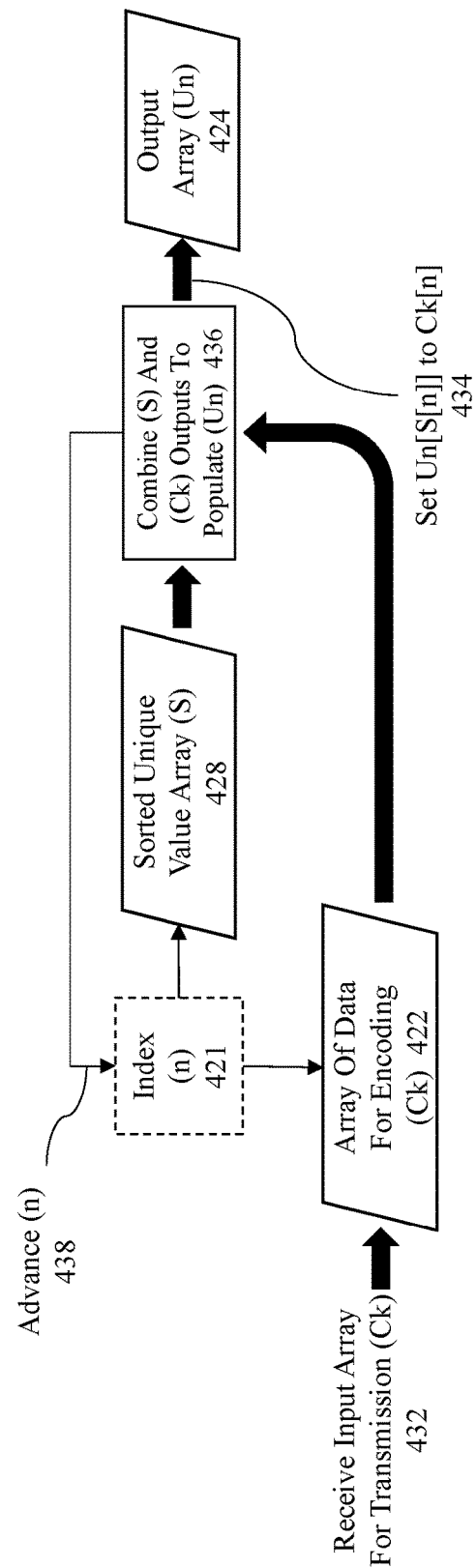

FIGS. 4A-4B illustrate a flow of an approach to generate an output array based on locations determined using the sorted unique value array and values determined using the data for polar encoding as in 204 of FIG. 2 according to some embodiments. Generally, the process uses the sorted unique value array and an array of data for encoding to generate an output array without comparing values within arrays. FIGS. 4A and 4B are intended to be discussed together in order to increase the clarity of the approach. Therefore, FIGS. 4A-4B will be discussed together and will be further illustrated in regard to FIGS. 6A-6D.

At 402 of FIG. 4A an index (n) is initialized which is represented by index (n) at 421 in FIG. 4B. In some embodiments, (n) is initialized to zero. Alternatively, (n) may be initialized to a maximum value, which is at least as large as the array of data for encoding (Ck).

At 404 of FIG. 4A the output array is set based on the array of data for encoding and the sorted unique value array. Specifically, the values of output array (Un) 424 are set at locations determined from S[n] with corresponding values from Ck[n]. For instance, for a given (n), output array (Un) 424 is set at Un[S[n]]=Ck[n]. Thus, if n=0 then Un[S[0]] =Ck[0]. This is illustrated in FIG. 4B, where the index (n) 421 is used as an index to read the sorted unique value array (S) 428 and array of data for encoding (Ck) 422. The outputs of reading the sorted unique value array (S) 428 and the array of data for encoding (Ck) 422, are combined at 436 to populate (Un) 424. This combination results in essentially the pseudo code: Un[S[n]]=Ck[n] at 434 to populate the output array (Un) 424.

At 406 of FIG. 4A, a determination is made as to whether an iteration target has been reached. For instance, if all the values in the array of data for encoding (Ck) 422 have been read, then the iteration limit has been reached. If the iteration limit has been reached, then the encoding process ends at 407. However, if the iteration limit has not yet been reached, then (n) is advanced (e.g. incremented or decremented) at 408 (see also 438) before returning to 404.

FIGS. 5A-5K illustrate an example of a flow of an approach to setup the sorted unique value array as in 200 of FIG. 2 and in FIG. 3 according to some embodiments.

Figure 5A:
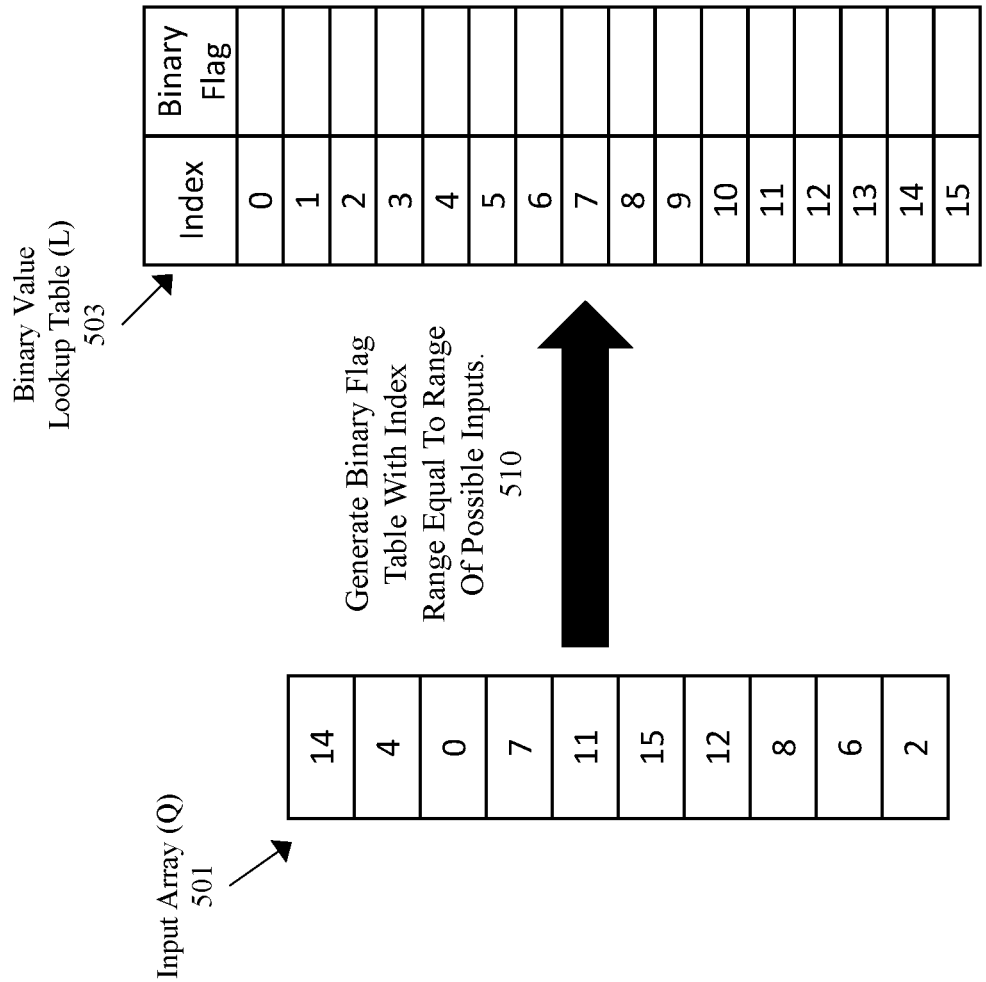

FIG. 5A includes an input array (Q) and a binary value lookup table (L). The input array (Q) 501 as illustrated here is populated with ten values {14,4,0,7,11,15,12,8,6,2}. The binary value lookup table (L) 503 has been instantiated at 510 such that the number of indexes corresponds to the possible values that could be in the input array (Q) 501 (0-15) as determined based on various parameters.

FIG. 5B illustrates the initialization of the values in the binary value lookup table. Specifically, all the binary flags in the binary value lookup table (L) 503 are set to false/zero at 511.

Figure 5C:
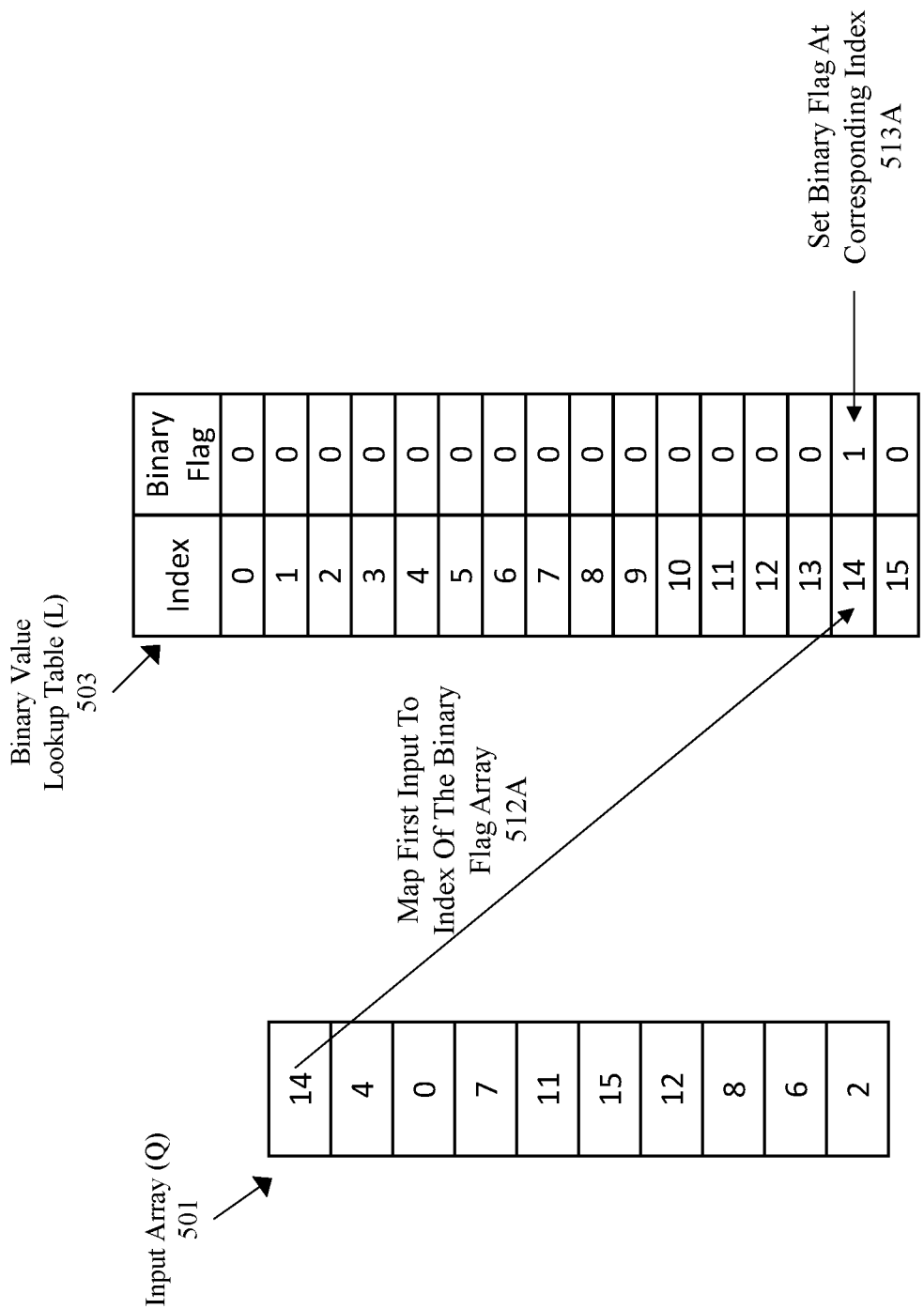
Figure 5D:
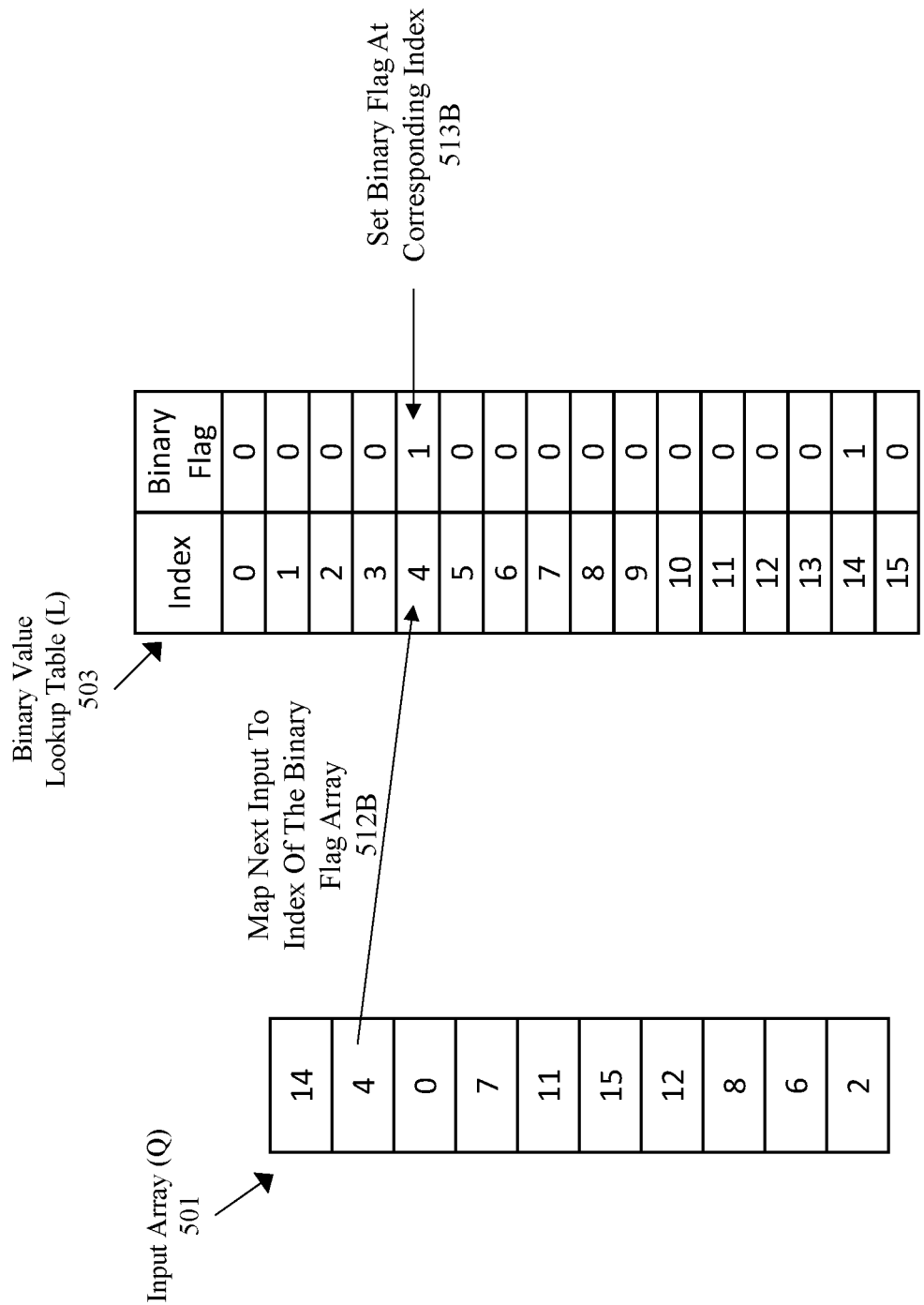
Figure 5E:
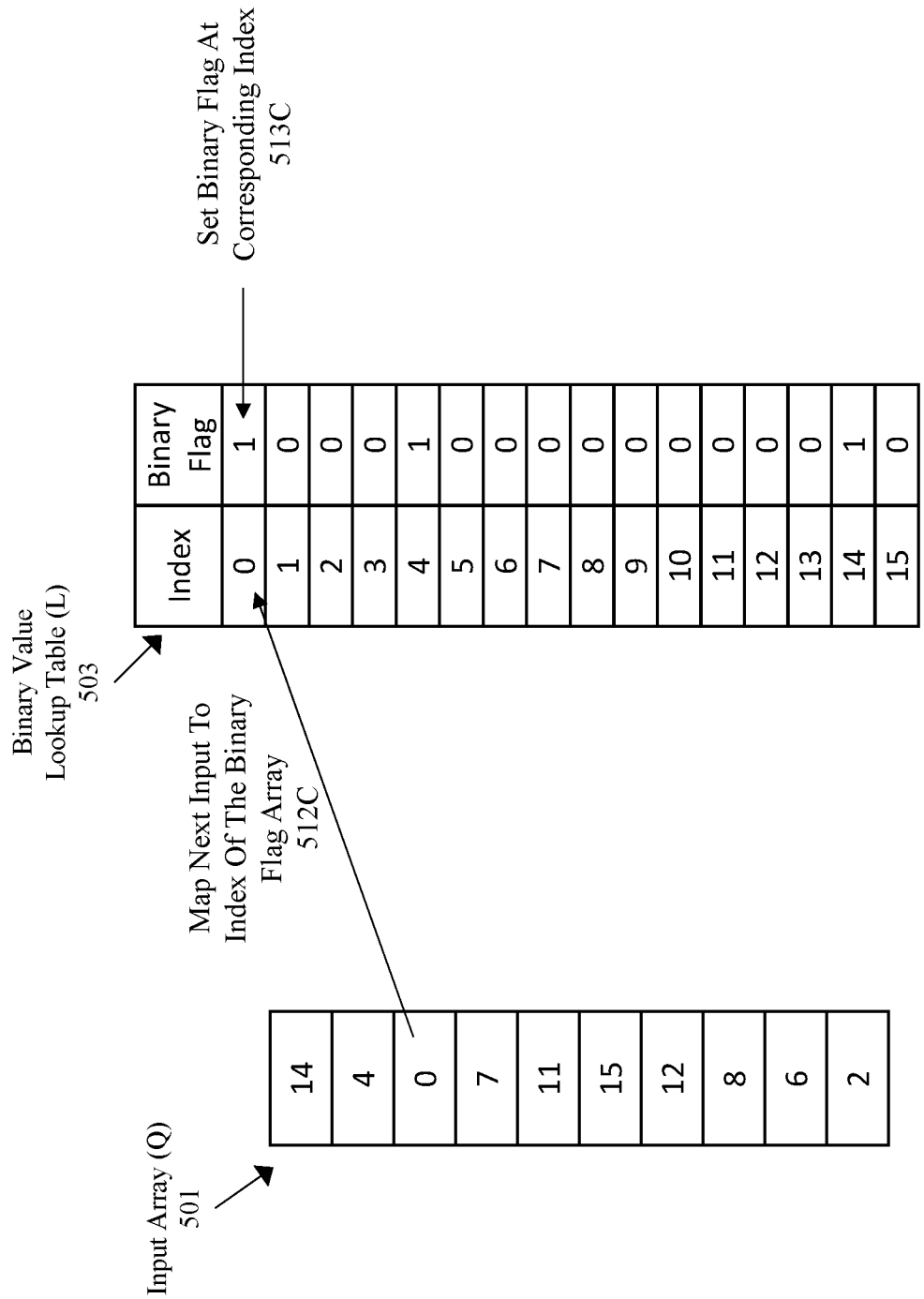

FIG. 5C illustrates a mapping operation and setting of a binary flag in the binary value lookup table at a location corresponding to the value in the input array. As illustrated, the value at the first location (index of i=0) of the input array (Q) 501 is mapped to the binary value lookup table (L) 503, at 512A, at a corresponding location where, the binary flag is set to one/true (see 513A). This can be represented by the L[Q[i]]=1 or L[14]=1. Similarly, FIG. 5D illustrates another mapping (see 512B) and setting operation (see 513B), where the corresponding binary flag is set to one/true (e.g. L[Q [i=1]]=1 or L[4]=1). FIG. 5E illustrates the same thing as 5D but for L[Q[i=2]]=1 or L[4]=1. (See 512C and 513C). Finally, FIG. 5F illustrates the mapping (512D-J) and setting (513D-J) of the corresponding binary flags at corresponding indexes for the remainder of input array (Q) 501.

Figure 5F:
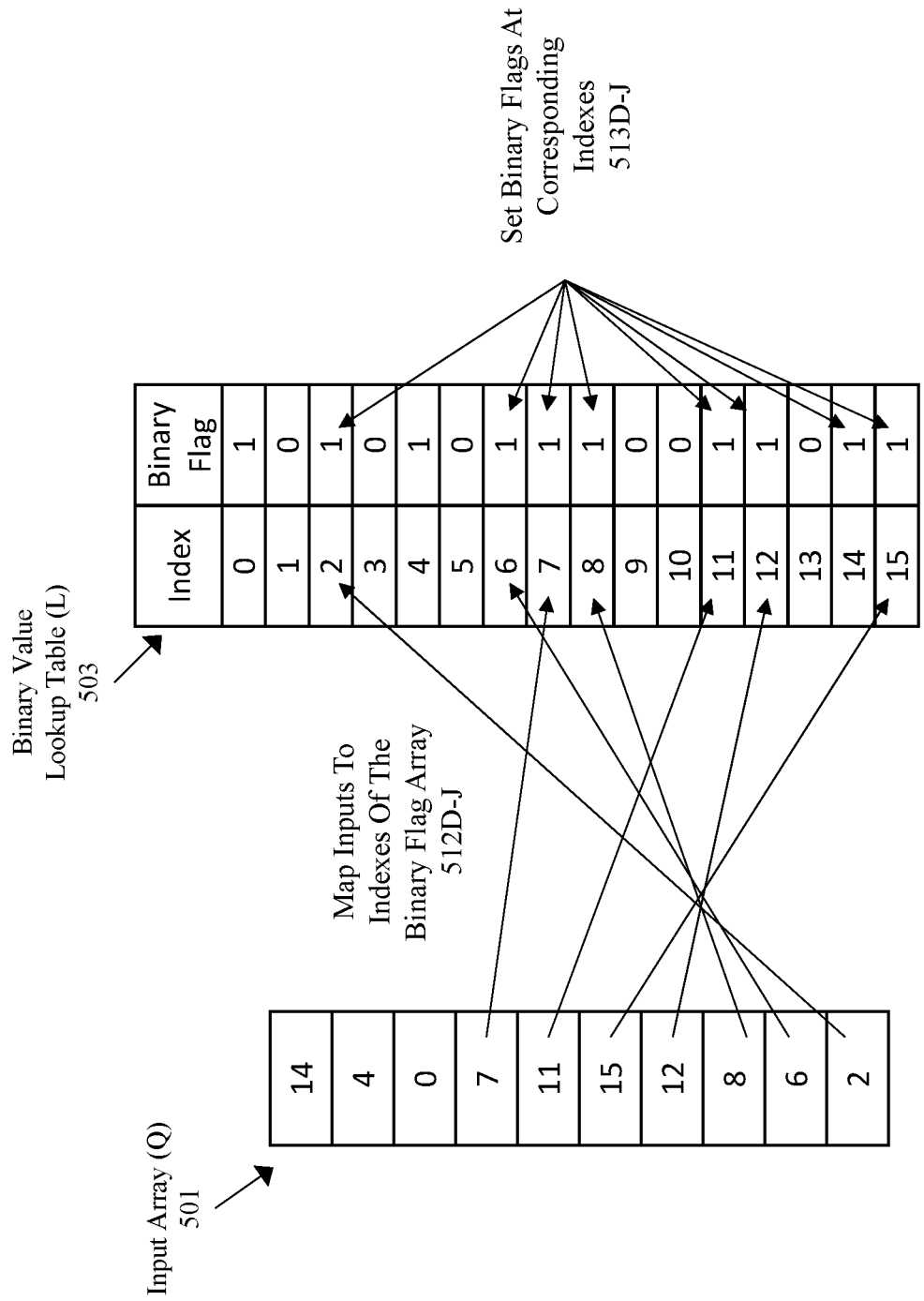
Figure 5G:
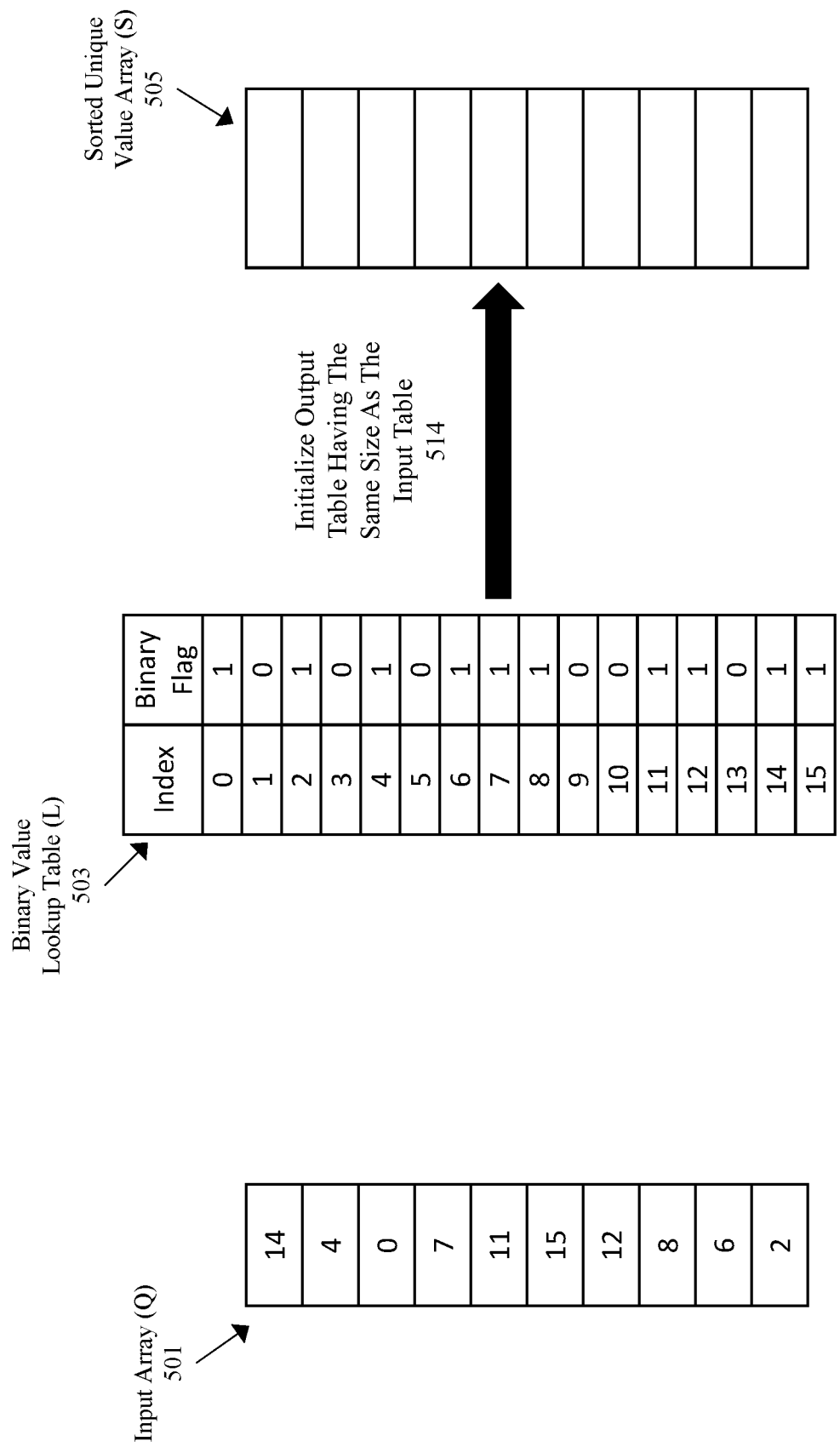

FIG. 5G adds the sorted unique value array to the illustration of FIG. 5F. Specifically, FIG. 5G illustrates, at 514, the instantiation of the sorted unique value array (S) 505.

FIGS. 5H-5K illustrate the population of the sorted unique value array (S) 505 by traversing the binary value lookup table (L). Specifically, a value "m" may be instantiated at an initial value (here at zero) where if the binary flag is set at the corresponding index, then that index is inserted into the sorted unique value array (S) 505, and a pointer is advanced to a new/next position in the sorted unique value array (S) 505.

Figure 5H:
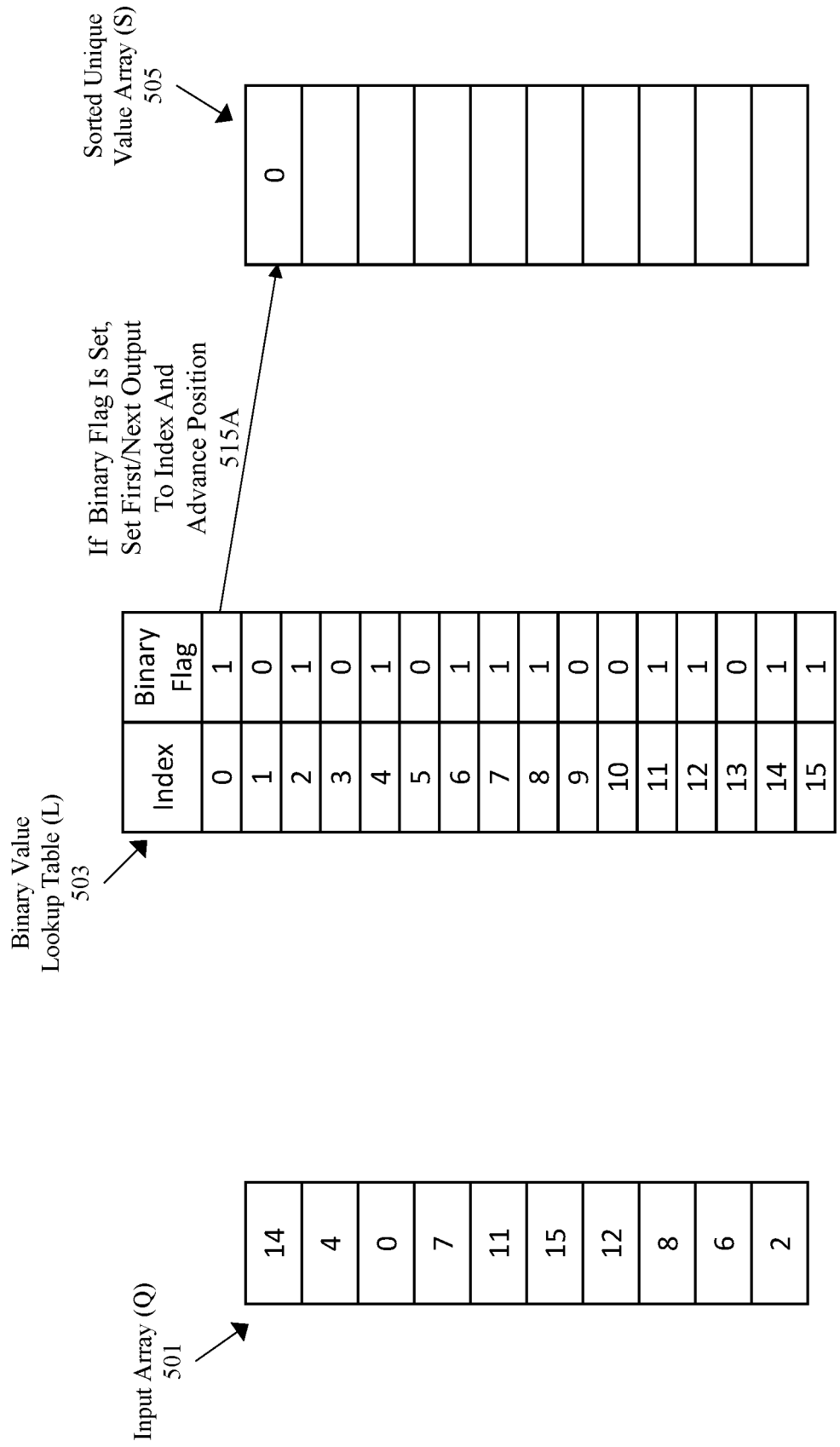

FIG. 5H illustrates the handling of the first binary flag at index location zero in binary value lookup table (L), where the binary flag happens to be set to 1 or true. Because the binary flag is set, an entry is created at the first available index location of the sorted unique value array (S) 505. In particular, the value zero is inserted into the sorted unique value array (S) 505.

Figure 5I:
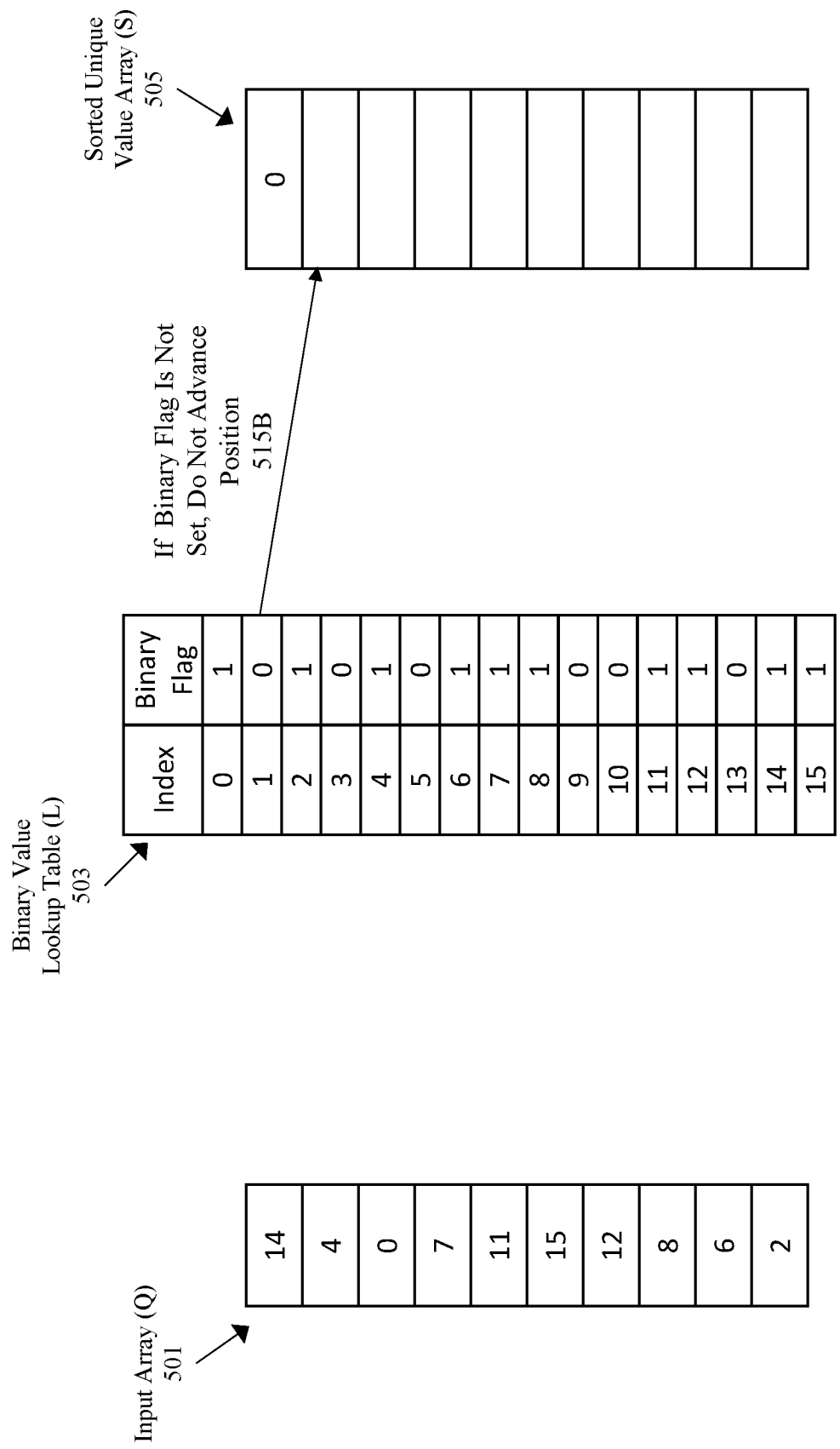
Figure 5J:
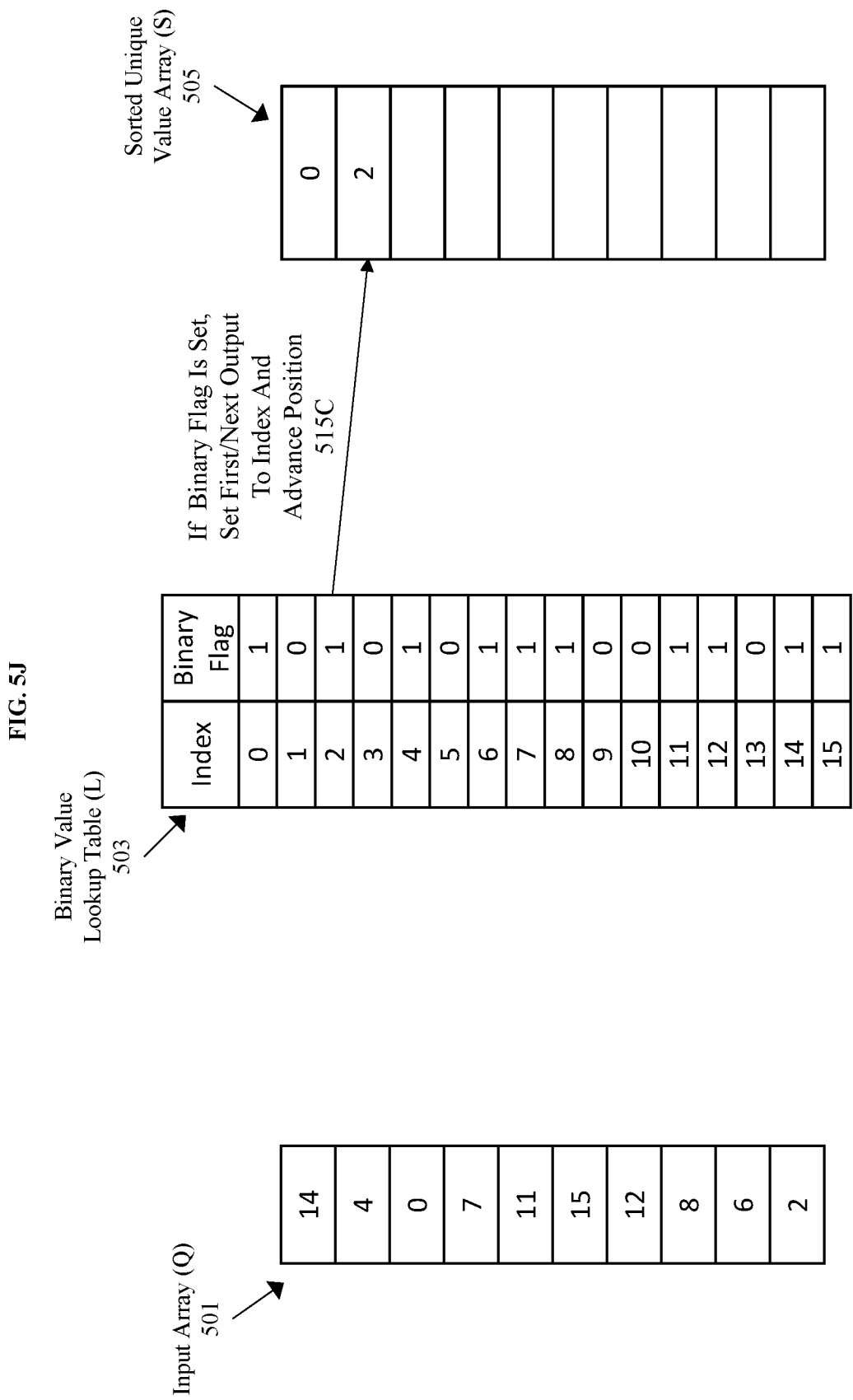

FIG. 5I illustrates the processing of a location in the binary value lookup table (L) that does not correspond to a set binary flag, but instead holds a zero value or value indicating that the flag is not set (e.g. false). As illustrated by 515B, the binary flag is not set and thus no value is added to the sorted unique value array (S) 505 and the pointer to the next available position in the sorted unique value array (S) 505 is not advanced. In contrast, FIG. 5J illustrates another instance, where the binary flag is set, and thus at 515C the value of the corresponding index is inserted into the sorted unique value array (S) 505 and the point is advanced.

Figure 5K:
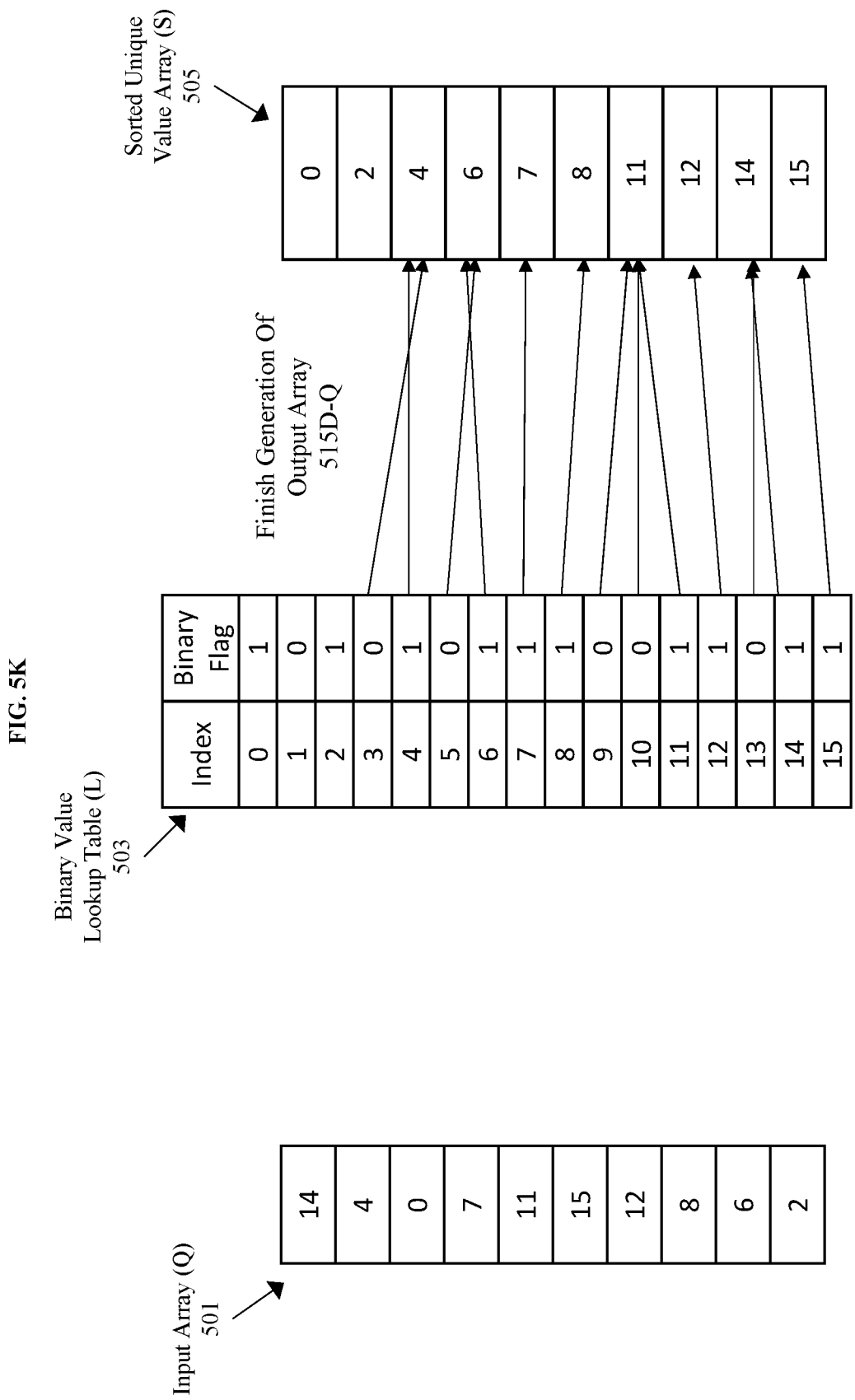

FIG. 5K illustrates the final/full traversal of the binary value lookup table (L) 503 to generate the sorted unique value array (S) 505 using processing logic as illustrated above in regard to FIGS. 5H-J. As can be seen from the illustration, the sorted unique value array (S) 505 the values in input array 501 but now in a sorted order—e.g. {0,2,4, 6,7,8,11,12,14,15}.

FIGS. 6A-6D illustrate an example of a flow of an approach to generate an output array based on locations determined using the sorted unique value array and values determined using the data for polar encoding as in 204 of FIG. 2 according to some embodiments. This example is, in part, a continuation of the example flow illustrated in FIGS. 5A-5K in that they operate using the sorted unique value array (S) 505 being populated with the same values from the previous flow.

FIG. 6A illustrates an input array of data for encoding (Ck), a sorted unique value array (S) and an output array (Un). Both the array of data for encoding (Ck) 603 and the sorted unique value array (S) 505 are used together to generated/populate the output array (Un) 607. Specifically, a shared index is used to read a value from each of the array of data for encoding (Ck) 603 and the sorted unique value array (S) 505. As illustrated, the process starts at 620 where the index n 421 is initialized to zero. Reading from the corresponding arrays provides for an output, at 625A, of 1 from the array of data for encoding (Ck) 603 and an output of zero from the sorted unique value array (S) 505. Subsequently, at 628A, Un[S[n]] is set to Ck[n], which can be represented at Un[0] is set to Ck[0]=1 in the output array (Un) 607.

Figure 6B:
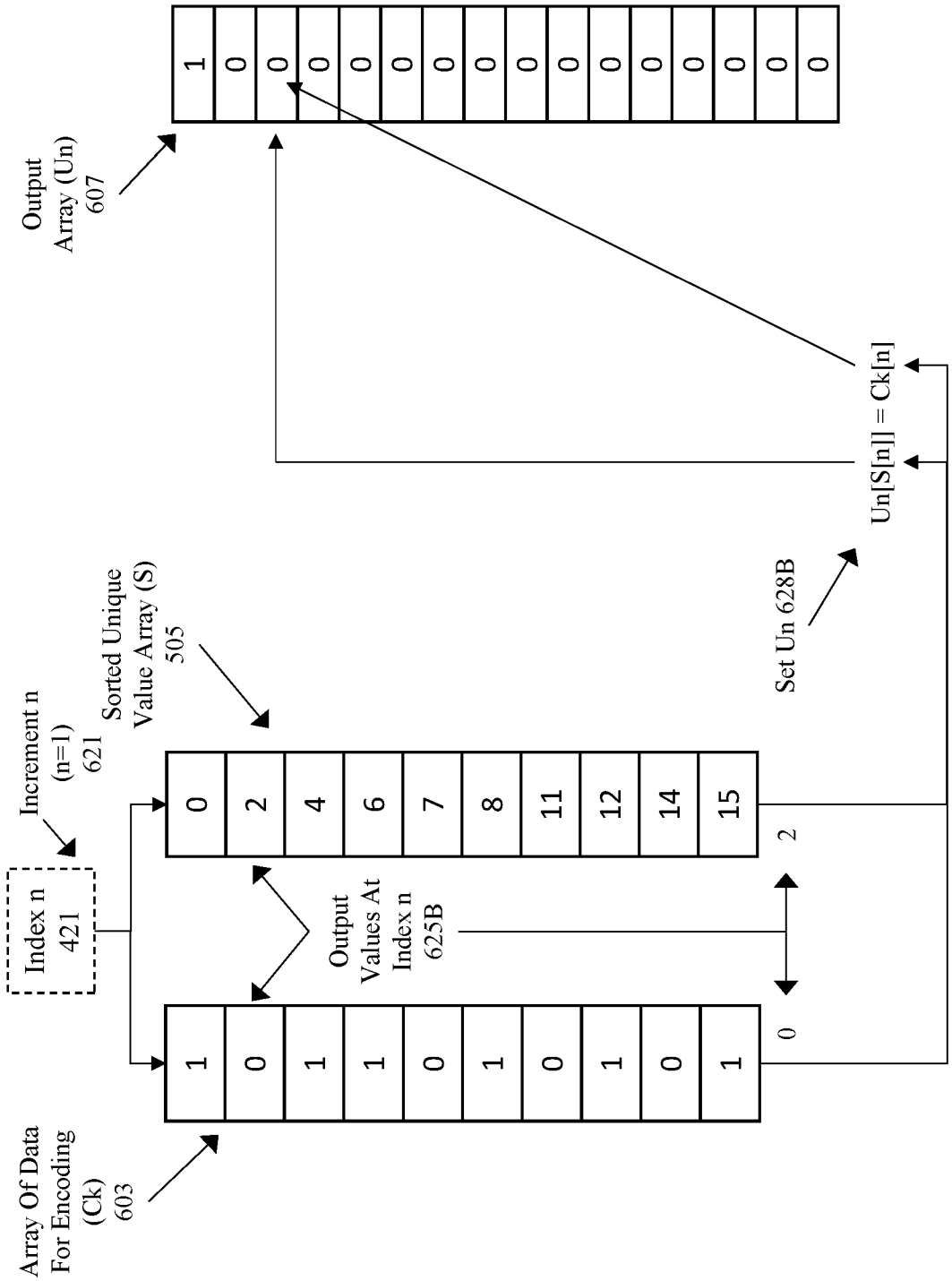

FIG. 6B continues the same illustration, but for the next position in the corresponding arrays. Specifically, at 621, the value of index n 421 is incremented, the array of data for encoding (Ck) 603 and the sorted unique value array (S) 505 are read at the next position using the incremented index n 421—resulting, at 625B, an output of zero is received from the array of data for encoding (Ck) 603 and an output of 2 from the sorted unique value array (S) 505. Finally, at 628B, Un[S[n]] is set to Ck[n], which can be represented at Un[2] is set to Ck[1]=0 in the output array (Un) 607.

Figure 6C:
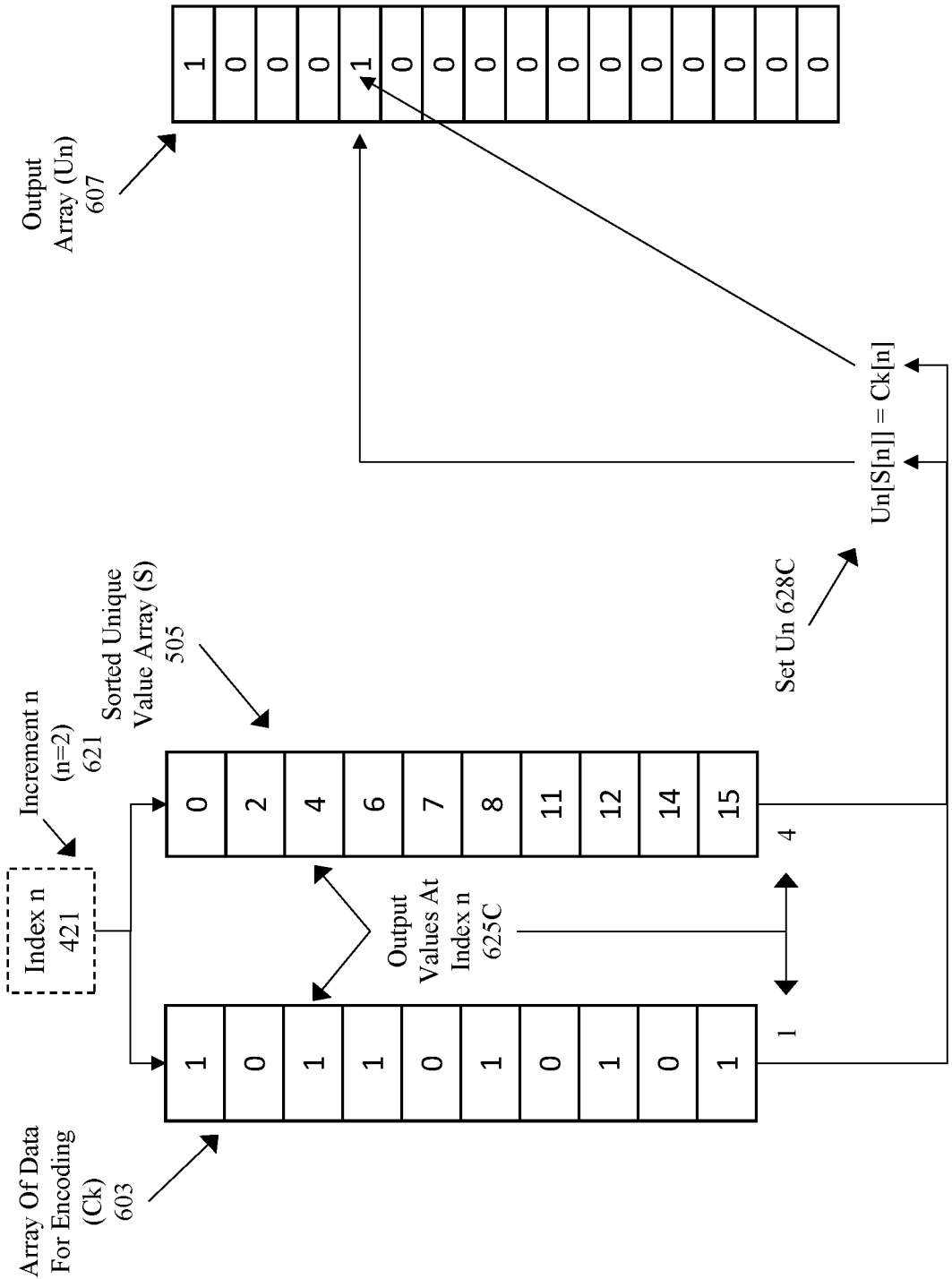

FIG. 6C illustrates essentially the same thing as FIG. 6B but with n incremented again to now equal 2. As a result, at 625B, an output of 1 from the array of data for encoding (Ck) 603 and an output of 2 from the sorted unique value array (S) 505 is generated and, at 628B, Un[S[n]] is set to Ck[n], which can be represented at Un[4] is set to Ck[2]=1 in the output array (Un) 607.

Figure 6D:
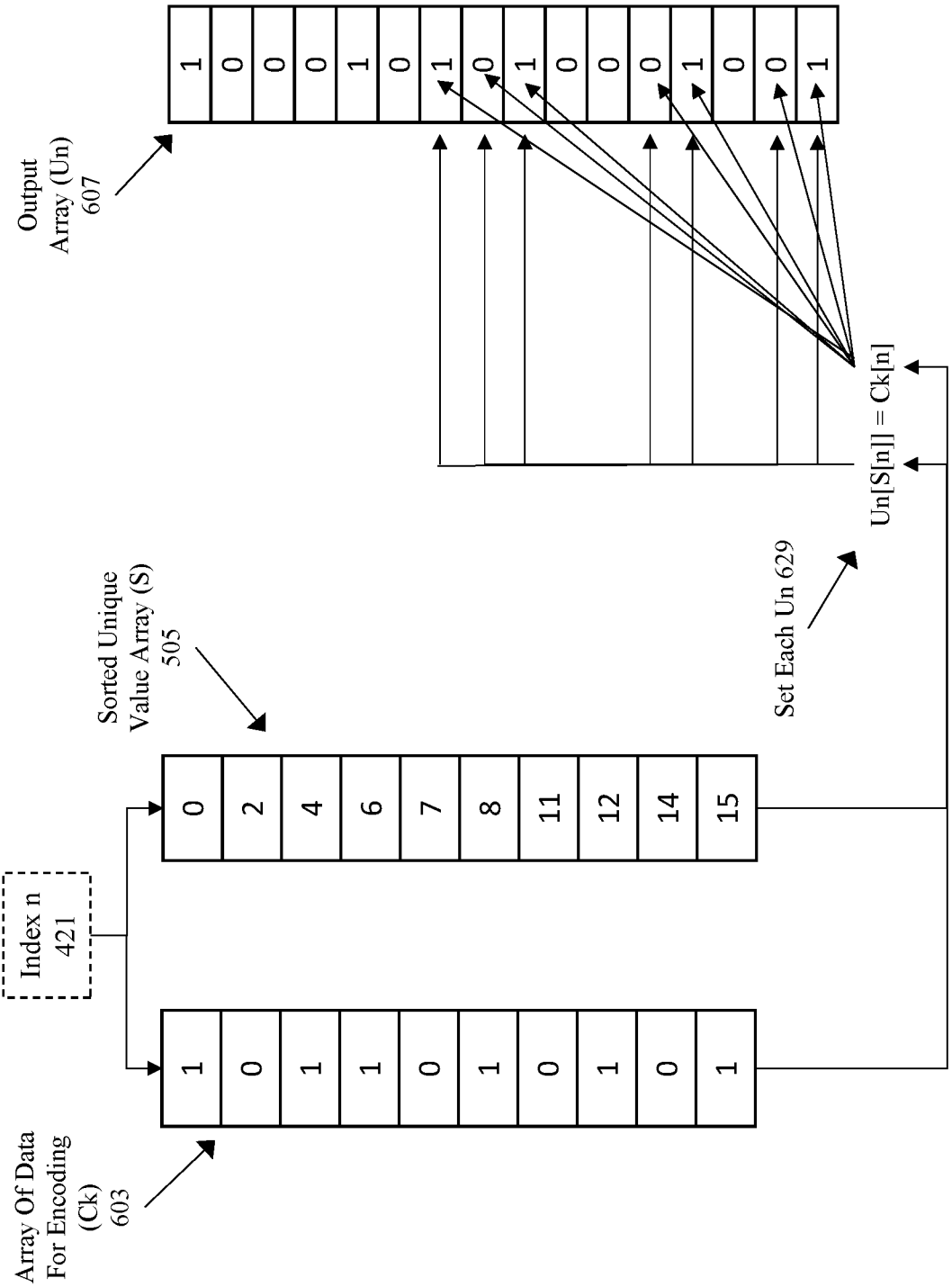

FIG. 6D illustrates the remainder of the traversal of the array of data for encoding (Ck) 603 and the sorted unique value array (S) 505 to generate the output array (Un) 607. Specifically, the process operates by iterating through the remainder of the locations in the array of data for encoding (Ck) 603 and the sorted unique value array (S) 505 and sets each corresponding value in the output array (Un) 607 at 629, where each value is set using code that can be represented as Un[S[n]]=Ck[n].

Thus, was is Embodiments of the present invention provide a method, system, and product to provide an improved approach to perform polar encoding. Specifically, the approach provided herein lowers power consumption and the amount of time/cycles/instructions requires to complete polar encoding operations.

System Architecture Overview

Figure 7:
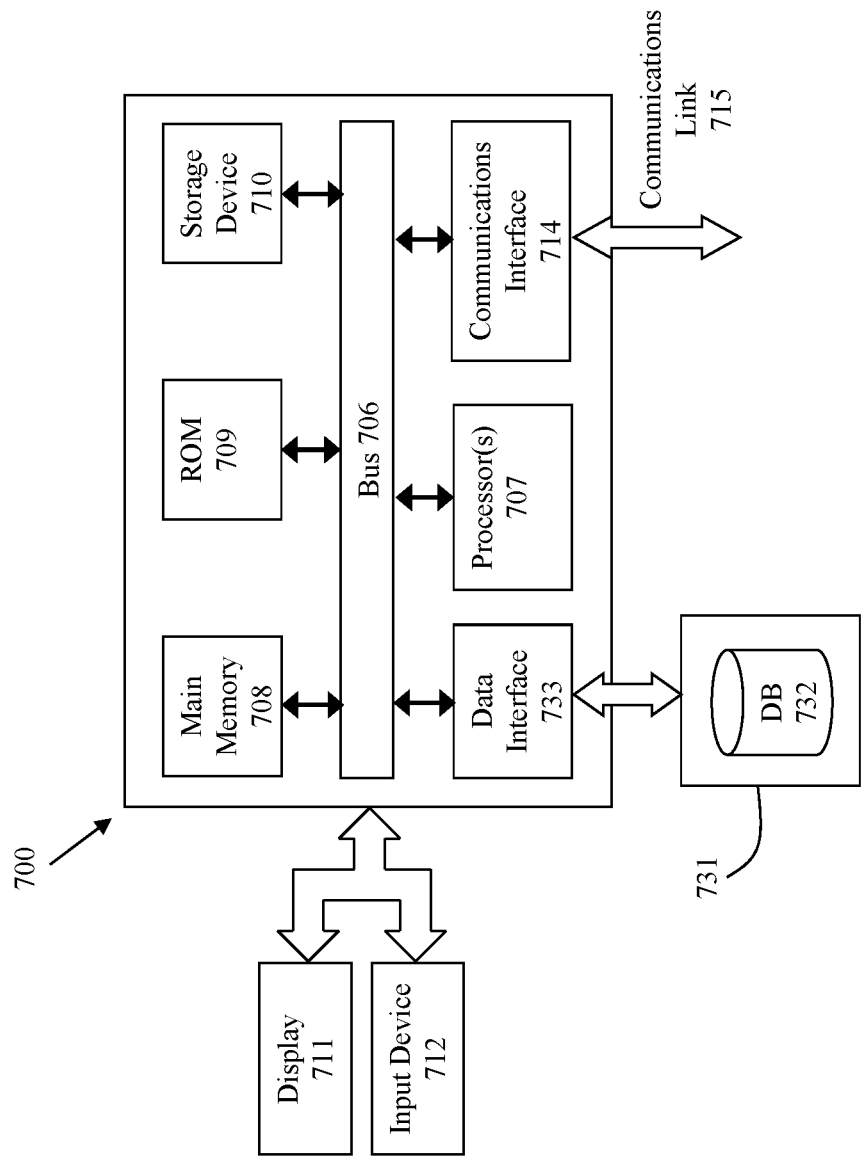
FIG. 7 shows an architecture of an example computing system with which the invention may be implemented.

FIG. 7 shows an architecture of an example computing system with which the invention may be implemented. Computer system 700 includes a bus 706 or other communication mechanism for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control.

According to one embodiment of the invention, computer system 700 performs specific operations by processor 707 executing one or more sequences of one or more instructions contained in system memory 708. Such instructions may be read into system memory 708 from another computer readable/usable medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program, i.e., application code, through communication link 715 and communication interface 714. Received program code may be executed by processor 707 as it is received, and/or stored in disk drive 710, or other non-volatile storage for later execution. Computer system 700 may communicate through a data interface 733 to a database 732 on an external storage device 731.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method, comprising:
   instantiating a sorted array of unique values by:
      instantiating a lookup table having a number of flags at locations identified by respective indexes,
      mapping each value in an input array to a matching index in the lookup table, and
      populating the sorted array of unique values by traversing the lookup table;
   receiving data for polar encoding;
   generating an output array based on locations determined using the sorted array of unique values and the data for polar encoding; and
   transmitting data based on at least the output array over a communication protocol.

2. The method of claim 1, further comprising clearing each flag in the lookup table to indicate that a value equal to a corresponding index has not been identified in an input array, determining a dimension for the lookup table based on the input array, wherein the lookup table is instantiated with dimension based on a range of possible values in an input array, and the number of flags is equal to the determined dimension.

3. The method of claim 1, wherein flags in the lookup table comprise binary values and mapping each value in the input array to a matching index in the lookup table further comprises setting a corresponding flag in the lookup table.

4. The method of claim 1, wherein the sorted array of unique values is instantiated with a same number of fields in the input array, traversing the lookup table is in a sort order, and populating the sorted array of unique values by traversing the lookup table further comprises inserting a respective index in a field in the sorted array of unique values that is not yet populated when a corresponding flag in the lookup table is set.

5. The method of claim 1, wherein the generating an output array based on locations determined using the sorted array of unique values and the data for polar encoding comprises iteratively recording entries in the output array, the entries comprising an output of the data for polar encoding at respective index values recorded at a respective locations, the respective locations being determined based on an output of the sorted array of unique values at the respective index value.

6. The method of claim 5, wherein entries are iteratively recorded until an iteration target is reached, and a plurality of locations are processed in parallel.

7. The method of claim 1, wherein the sorted array of unique values is instantiated is before receiving the data for polar encoding.

8. The method of claim 1, wherein the communication protocol is a 5G wireless communication protocol.

9. A non-transitory computer readable medium having stored thereon a sequence of instructions which, when executed by a processor performs a set of acts, the set of acts comprising:
generating a sorted array of unique values by:
instantiating a lookup table having a number of flags at locations identified by respective indexes,
mapping each value in an input array to a matching index in the lookup table, and
populating the sorted array of unique values by traversing the lookup table;
identifying data for polar encoding;
generating an output array based on entries identified using the sorted array of unique values and the data for polar encoding; and
transmitting data based on at least the output array over a communication protocol.

10. The computer readable medium of claim 9, further comprising clearing each flag in the lookup table to indicate that a value equal to a corresponding index has not been identified in an input array, determining a dimension for the lookup table based on the input array, wherein the lookup table is instantiated with dimension based on a range of possible values in an input array, and the number of flags is equal to the determined dimension.

11. The computer readable medium of claim 9, wherein flags in the lookup table comprise binary values and mapping each value in the input array to a matching index in the lookup table further comprises setting a corresponding flag in the lookup table.

12. The computer readable medium of claim 9, wherein the sorted array of unique values is instantiated with a same number of fields in the input array, traversing the lookup table is in a sort order, and populating the sorted array of unique values by traversing the lookup table further comprises inserting a respective index in a field in the sorted array of unique values that is not yet populated when a corresponding flag in the lookup table is set.

13. The computer readable medium of claim 9, wherein the generating an output array based on entries identified using the sorted array of unique values and the data for polar encoding comprises iteratively recording entries in the output array, the entries comprising an output of the data for polar encoding at respective index values recorded at respective locations, the respective locations being determined based on an output of the sorted array of unique values at the respective index value.

14. The computer readable medium of claim 13, wherein entries are iteratively recorded until an iteration target is reached, and a plurality of locations are processed in parallel.

15. The computer readable medium of claim 9, wherein the sorted array of unique values is generated before receiving the data for polar encoding.

16. The computer readable medium of claim 9, wherein the communication protocol is a 5G wireless communication protocol.

17. A system, comprising:
memory comprising a sequence of instructions; and
a processor that executes the sequence of instructions to perform a set of acts comprising:
creating a sorted array of unique values;
instantiating a lookup table having a number of flags at locations identified by respective indexes,
mapping each value in an input array to a matching index in the lookup table, and
populating the sorted array of unique values by traversing the lookup table;
collecting data for polar encoding;
generating an output array, the output array being generated by writing the data for polar encoding at locations determined using the sorted array of unique values; and
transmitting data based on at least the output array over a communication protocol.

18. The system of claim 17, further comprising clearing each flag in the lookup table to indicate that a value equal to a corresponding index has not been identified in an input array, determining a dimension for the lookup table based on the input array, wherein the lookup table is instantiated with dimension based on a range of possible values in an input array, and the number of flags is equal to the determined dimension.

19. The system of claim 17, wherein flags in the lookup table comprise binary values and mapping each value in the input array to a matching index in the lookup table further comprises setting a corresponding flag in the lookup table.

20. The system of claim 19, wherein the sorted array of unique values is instantiated with a same number of fields in the input array, traversing the lookup table is in a sort order, and populating the sorted array of unique values by traversing the lookup table further comprises inserting a respective index in a field in the sorted array of unique values that is not yet populated when a corresponding flag in the lookup table is set.

* * * * *